United States Patent
Mahler et al.

(10) Patent No.: US 9,666,499 B2
(45) Date of Patent: May 30, 2017

(54) SEMICONDUCTOR DEVICE WITH ENCAPSULANT

(71) Applicant: Infineon Technologies AG

(72) Inventors: Joachim Mahler, Regensburg (DE); Edward Fuergut, Dasing (DE); Khalil Hosseini, Weihmichl (DE); Georg Meyer-Berg, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/664,418

(22) Filed: Oct. 31, 2012

(65) Prior Publication Data

US 2014/0117531 A1     May 1, 2014

(51) Int. Cl.
*H01L 23/29* (2006.01)
*H01L 21/56* (2006.01)
*H01L 23/00* (2006.01)

(52) U.S. Cl.
CPC .......... *H01L 23/291* (2013.01); *H01L 21/561* (2013.01); *H01L 21/568* (2013.01); *H01L 23/296* (2013.01); *H01L 23/562* (2013.01); *H01L 23/564* (2013.01); *H01L 2924/0002* (2013.01)

(58) Field of Classification Search
CPC ... H01L 21/561; H01L 21/568; H01L 23/291; H01L 23/296; H01L 23/562; H01L 23/564
USPC ........ 438/106, 112, 124, 127, 113; 257/789, 257/794, E23.118, E23.119
See application file for complete search history.

(56) References Cited

U.S. PATENT DOCUMENTS

| | | | |
|---|---|---|---|
| 7,994,646 B2 * | 8/2011 | Mahler et al. | 257/789 |
| 2006/0175583 A1 * | 8/2006 | Bauer et al. | 252/511 |
| 2010/0148381 A1 * | 6/2010 | Mahler et al. | 257/794 |

\* cited by examiner

*Primary Examiner* — Bilkis Jahan
*Assistant Examiner* — Victor Barzykin
(74) *Attorney, Agent, or Firm* — Dicke, Billig & Czaja, PLLC

(57) ABSTRACT

Described are techniques related to semiconductor devices that make use of encapsulant. In one implementation, a semiconductor device may be manufactured to include at least an encapsulant that includes at least glass particles.

15 Claims, 3 Drawing Sheets

SEMICONDUCTOR DEVICE WITH ENCAPSULANT

BACKGROUND

In general, semiconductor packages include at least one semiconductor chip covered with a plastic or epoxy encapsulation material. Some electronic devices are employed in high temperature applications, for example, automotive applications, and operate in demanding environments. Thermal cycling of the semiconductor package has the potential to cause the semiconductor chip to separate from the plastic or epoxy encapsulation material. Such separation of the semiconductor chip from the plastic or epoxy encapsulation material may create an opening for the ingress of moisture. The moisture ingress may corrode electrical connections on a chip associated with the semiconductor package and has the potential to warp or otherwise affect the dimensions of the chip.

SUMMARY

Described herein are techniques related to semiconductor devices that make use of encapsulant. In one implementation, a semiconductor device may be manufactured to include at least an encapsulant that includes at least glass particles. The use of an encapsulant that includes glass particles provides improved thermal stability, which minimizes or eliminates moisture ingress between the encapsulant and chip(s) of the package, thus configuring the package for improved reliability over a broader thermal spectrum of use. Furthermore, the use of such an encapsulant provides enhanced dielectric strength compared to conventional encapsulant materials.

This Summary is submitted with the understanding that it will not be used to interpret or limit the scope or meaning of the claims. This Summary is not intended to identify key features or essential features of the claimed subject matter, nor is it intended to be used as an aid in determining the scope of the claimed subject matter.

BRIEF DESCRIPTION OF THE DRAWINGS

The Detailed Description references the accompanying figures. In the figures, the left-most digit(s) of a reference number identifies the figure in which the reference number first appears. The same numbers are used throughout the drawings to reference like features and components

DETAILED DESCRIPTION

Described herein are techniques related to semiconductor devices that make use of encapsulant. In one implementation, a semiconductor device may be manufactured to include at least an encapsulant that includes at least glass particles. The use of an encapsulant that includes glass particles provides improved thermal stability, which minimizes or eliminates moisture ingress between the encapsulant and chip(s) of the package, thus configuring the package for improved reliability over a broader thermal spectrum of use. Furthermore, the use of such an encapsulant provides enhanced dielectric strength compared to conventional encapsulant materials.

Figure 1:
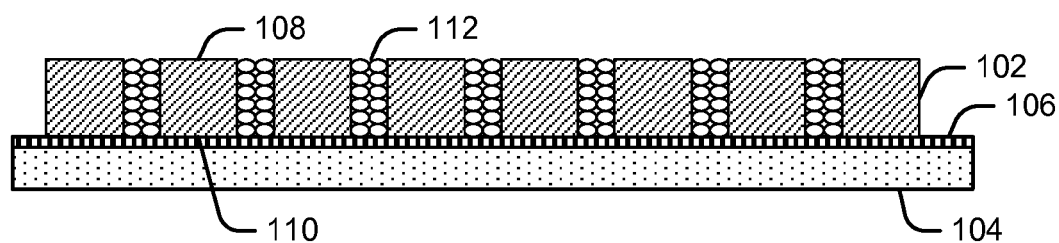
FIG. 1 illustrates an embodiment in which semiconductor chips are placed at a predetermined spacing on a wafer carrier.

FIG. 1 illustrates an embodiment in which semiconductor chips 102 are placed at a predetermined spacing on the wafer carrier 104 coupled with an adhesive 106, which may be an adhesive foil or other similar material. In one embodiment, the chips 102 include control chips, logic chips, vertical high voltage chips, power transistor chips, metal oxide semiconductor field effect transistor chips, or other suitable semiconductor dies. In one embodiment, at least two semiconductor chips 102 are placed with a first face 108 exposed and a second face 110 attached to the adhesive 106. The first face 108 may include one or more contacts, such as a source terminal, gate terminal, anode terminal or the like. Furthermore, the second face 110 may include one or more such contacts.

In one embodiment, the adhesive 106 is a metallization layer such as a metalized adhesive, metalized seed layer, metalized substrate, a carrier, foil, or other suitable metallic layer. In one embodiment, the wafer carrier 104 is configured to include the chips 102 spaced apart to define a "fan-out" area on the wafer, and a metalized seed layer is deposited onto a major surface of a reconfigured wafer by chemical deposition, electroless deposition, or sputtering. In another embodiment, the chips are disposed onto a carrier including a metallic layer.

Figure 2:
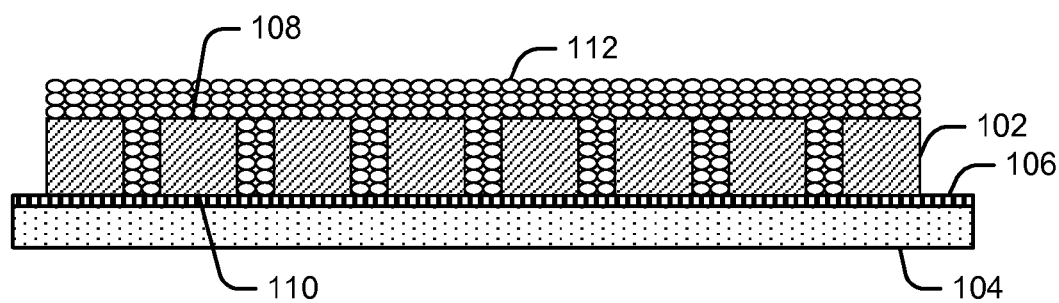
FIG. 2 illustrates an embodiment in which semiconductor chips are placed at a predetermined spacing on a wafer carrier.

As is illustrated in FIG. 1, in an embodiment, an encapsulant 112 is applied between the semiconductor chips 102 on wafer carrier 104. In another embodiment, the encapsulant 112 is applied between the semiconductor chips 102 on wafer carrier 104 and over the semiconductor chips 102, as illustrated in FIG. 2. With such an embodiment, it is possible to immediately remove the wafer carrier 104 and perform further process steps after the encapsulant 112 is applied between the semiconductor chips 102 on wafer carrier 104 and over the semiconductor chips 102 is hardened. The description and related figures described in the following apply to the embodiments illustrated in FIGS. 1 and 2.

In one embodiment, the encapsulant 112 includes inorganic particles (e.g., glass). The encapsulant 112 is configured to have a coefficient of thermal expansion (CTE) of less than approximately $10 \times 10^{-6}/K$, which closely approximates the CTE of silicon in silicon chips (about $2.5 \times 10^{-6}/K$). In contrast, conventional epoxy or polymer encapsulant materials typically have a larger CTE of approximately $1 \times 10^{-5}/K$, or about an order of magnitude larger than the CTE for silicon. The mismatch between the CTE of the conventional epoxy or polymer encapsulant materials and silicon contributes to unequal thermal expansion of the materials as the materials are thermally cycled, which has the potential to undesirably separate the materials and create a pathway for moisture ingress to the semiconductor package.

Suitable materials for the encapsulant 112 include inorganic materials. In one embodiment, the encapsulant 112 is provided as a ceramic material. In one embodiment, the encapsulant 112 is provided as an organo-metallic material. Suitable organo-metallic materials include polysiloxane and organically modified silicates. In one embodiment, the encapsulant 112 is provided to include glass or glass particles. Suitable glass materials include sulfophosphate glasses present in the glass/plastic compounds.

In one embodiment, the encapsulant 112 is hardened through a sintering process in which the particles are fused together to solidify or harden the encapsulant 112. In one embodiment, the encapsulant 112 is fabricated as a sol-gel from a suspension of organo-metallic or ceramic nanoparticles, and including glass, with processing temperatures between approximately 200-400 degrees Celsius. In one embodiment, the encapsulant 112 is deposited as a paste in a printing process, like a base-printing or template-printing, and then processed at temperatures between 300-450 degrees Celsius to harden the particles into a sintered mass.

After curing, the encapsulant 112 provides stability to the array of semiconductor chips 102 with temperature stability of greater than 300 degrees Celsius and moisture resistance. The encapsulant 112 allows for lower coefficient of thermal expansion as compared to other (e.g., epoxy) materials. The encapsulant 112 results in less corrosion of the devices due to ionic contamination. In one embodiment, the encapsulant 112 provides a hermetic seal around the semiconductor chip 102 and is configured to impede moisture ingress. Various techniques are employed to embed the semiconductor chips 102 with the encapsulant 112, for example, compression molding, and injection molding, lamination or dispensing.

Figure 3:
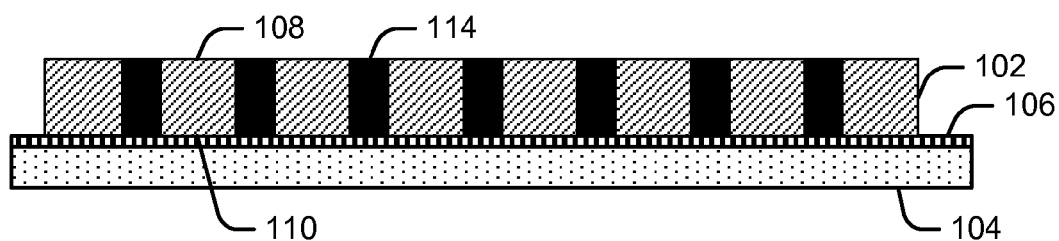
FIG. 3 illustrates encapsulant solidified into encapsulant material while semiconductor chips are adhered to a wafer carrier.

FIG. 3 illustrates the encapsulant 112 solidified into an encapsulant material 114 while the semiconductor chips 102 are adhered to the wafer carrier 104. In one embodiment, the encapsulant 112 is solidified through a sintering process in which the encapsulant 112 reacts and solidifies into the encapsulant material 114. In one embodiment, the encapsulant 112 and/or the hardened encapsulant material 114 is planarized to the top surface 108 of the semiconductor chips 102.

Figure 4:
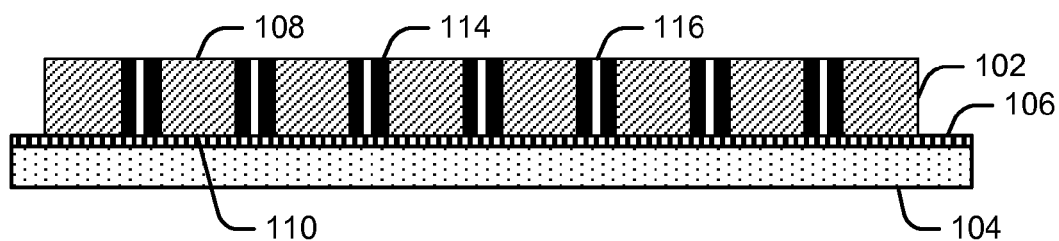
FIG. 4 illustrates encapsulant material and the semiconductor chips adhered to a wafer carrier after dicing.

FIG. 4 illustrates the encapsulant material 114 and the semiconductor chips 102 adhered to the wafer carrier 104 after dicing. Dicing is used to provide through openings 116 of the encapsulant material 114 between the semiconductor chips 102 after hardening. In one embodiment, dicing methods known in the industry are used such as sawing and cutting through the encapsulant material 114 until the adhesive layer 106 is reached. In one embodiment, the semiconductor chips 102 are separated so that the encapsulant material 114 remains attached to the sides of the semiconductor chips 102. In one embodiment, the semiconductor chips 102 are separated so that the encapsulant material 114 does not remain attached to the sides of the semiconductor chips 102.

Figure 5:
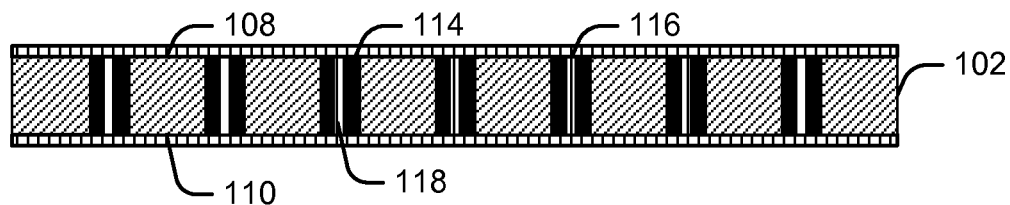
FIG. 5 illustrates a semiconductor structure according to one embodiment after a wafer carrier has been released.

FIG. 5 illustrates a semiconductor structure according to one embodiment after the wafer carrier 104 has been released. In one embodiment, a metalized material 118 is deposited into the through openings 116 between each semiconductor chip 102. In one embodiment, the metalized material 118 laterally extends over the active first face 108 of the semiconductor chip 102 and is electrically connected to contacts on the first face 108. In one embodiment, the metalized material 118 extends laterally over the second face 110 of the semiconductor chip 102. In another embodiment, the metalized material 118 that extends laterally over the second face 110 is strengthened galvantically to the desired thickness of up to 250 µm, in one example.

Figure 6:
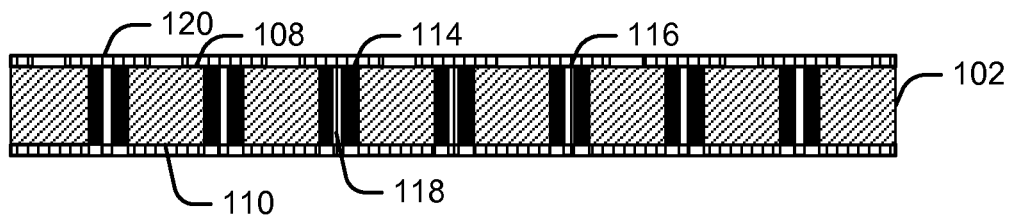
FIG. 6 illustrates a semiconductor structure according to one embodiment after selective etching of a metalized layer on portions of the semiconductor structure.

FIG. 6 illustrates a semiconductor structure according to one embodiment after selective etching of the metalized layer 118 on portions of the semiconductor structure to provide selectively etched metal deposits 120. The semiconductor chip 102 is connected to the selectively etched metal deposits 120 at contacts on the first face 108 of the semiconductor chip 102. The metal deposits 120 extend from the first face 108 of the semiconductor chip 102 between encapsulant material 114 to the second face 110. In one embodiment, the metal deposit 120 was selectively etched on the second face 110 of the semiconductor chip 102 to remain insulated by the encapsulant material 114. In another embodiment, the metal deposit 120 was selectively etched on the first face 108 of the semiconductor chip 102. More specifically the structure is subjected to an etchant. The etchant material depends on the composition of the metalized material. In one embodiment, photolithic or laser methods are employed such that between the gate source and drain contacts of the individual units, no electrically conductive connections remain.

Figure 7:
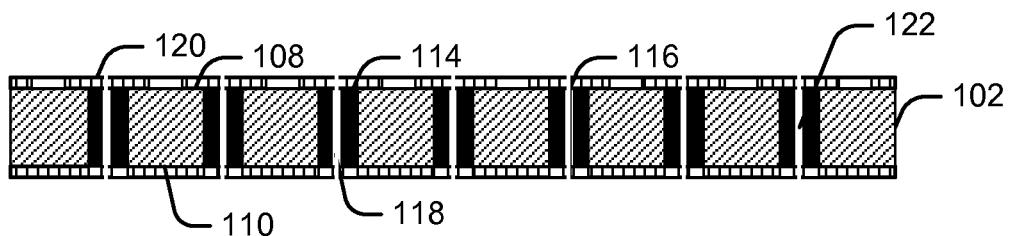
FIG. 7 illustrates a semiconductor structure according to one embodiment after separation of the semiconductor devices.

FIG. 7 illustrates a semiconductor structure according to one embodiment after separation of the semiconductor devices. The metal deposits 120 have been sawn or otherwise separated 122 such that source drains on either side of through openings 116 extend from metal deposits 120 on the first face 108 to the second face 110 of the semiconductor chip 102. In one embodiment, separation is provided through singulation. In this manner, isolated semiconductor devices may be placed on printed circuit boards with the first face 108, the active face, of semiconductor chip 102 coupled to the printed circuit board.

In an alternative embodiment, prior to sigulation as described in connection with FIG. 7, an encapsulant material having glass particles, such as the encapsulant material 112 for example, is provided over at least the first face 108, the active face, and the metal deposits 120. Such encapsulant material having glass particles is then hardened. Thereafter, sigulation is performed in the matter described in connection with FIG. 7.

Figure 8:
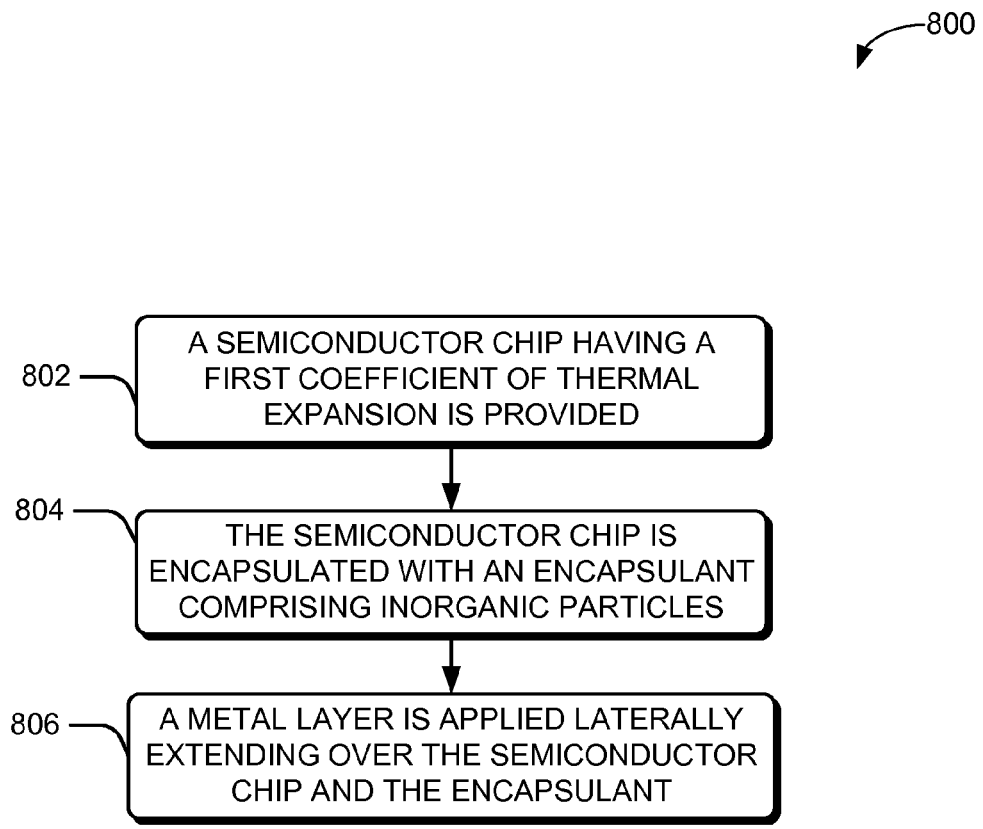
FIG. 8 illustrates representative process for providing an encapsulated chip, or a semiconductor package that uses encapsulant material.

FIG. 8 illustrates representative process 800 for providing an encapsulated chip, or a semiconductor package that uses encapsulant material. In various implementations, the process 800 may be performed by equipment associated with a fabrication facility. Such a fabrication facility may include, for example, production units, with which different production processes can be carried out. The production processes are, in a particular example, etching processes, wet chemical methods, diffusion processes and different cleaning processes, such as a chemical mechanical polishing (CMP) process. For each of the processes, one or more production units may be provided, in which various production steps in a production process are carried out In various implementations, the components may include one or more of switches, inductances, diodes, and the like.

At act 802, a semiconductor chip having a first coefficient of thermal expansion is provided. Such a semiconductor chip may be similar to the semiconductor chips 102. At act 804, the semiconductor chip is encapsulated with an encapsulant comprising inorganic particles. Such inorganic particles may include glass. At act 806, a metal layer is applied to laterally extend over the semiconductor chip and the encapsulant.

In the foregoing Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figures(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements are directly coupled together; intervening elements may be provided between the "coupled" or "electrically coupled" elements.

Embodiments provide for reducing stress as semiconductor devices are exposed to high temperatures and protecting the semiconductor chips against moisture damage to electrical contacts.

Embodiments provide encapsulant for wafer level packaging of semiconductor devices. An encapsulant of inorganic particles is deposited between the semiconductor chips spaced on the carrier. The encapsulant particles are hardened between the chips and subsequently sawn or otherwise divided to provide through-openings. An electrically conducting material is placed between the newly divided encapsulant and attached to the first face and second face of the semiconductor chips. Etching or other methods used in the semiconductor industry is implemented on the electrically conducting material placed on the first and second face to provide electrical pathways. In one embodiment, the electrically conductive material is structured to provide separate gate, source, and drain contacts for each chip. The semiconductor packages are singulated from the wafer for subsequent use with other devices. After singulation from the wafer, complete semiconductor packages are provided that are suited for assembly and/or attachment to printed circuit boards and other electronic devices.

What is claimed is:

1. A method, comprising:
providing a semiconductor chip having a first coefficient of thermal expansion;
encapsulating the semiconductor chip with an encapsulant that includes inorganic materials and sulfophosphate glass particles; and
hardening the encapsulant into an encapsulant material by processing the encapsulant at a temperature between 300-450 degrees Celsius to solidify both the inorganic materials and the sulfophosphate glass particles.

2. The method according to claim 1, wherein the encapsulant additionally comprises organic material.

3. The method according to claim 1, further comprising applying a metal layer laterally extending over the semiconductor chip and the encapsulant material.

4. The method according to claim 1, wherein the encapsulant has a second coefficient of thermal expansion different than the first coefficient of thermal expansion.

5. The method according to claim 1, wherein first coefficient of thermal expansion is approximately $2.5 \times 10^{-6}$/K.

6. The semiconductor device of claim 4, wherein second coefficient of thermal expansion is less than approximately $10 \times 10^{-6}$/K.

7. A semiconductor device, comprising:
a semiconductor chip having a first coefficient of thermal expansion; and
an encapsulant material that includes inorganic materials and sulfophosphate glass, wherein the encapsulant material encapsulates the semiconductor chip, and wherein the encapsulant material is formed from an encapsulant that includes the inorganic materials and sulfophosphate glass particles that have been hardened by processing the encapsulant at a temperature between 300-450 degrees Celsius to solidify both the inorganic materials and the sulfophosphate glass particles.

8. The semiconductor device of claim 7, wherein the encapsulant additionally comprises organic material.

9. The semiconductor device of claim 7, further comprising a metal layer laterally extending over the semiconductor chip and the encapsulant material.

10. The semiconductor device of claim 7, wherein the chip includes a first electrode and a second electrode.

11. The semiconductor device of claim 10, wherein the first electrode is electrically coupled to a metal layer laterally extending over the semiconductor chip and the encapsulant material.

12. The semiconductor device of claim 7, wherein the semiconductor chip comprises a power transistor with a first electrode connected with a drain and a second electrode connected with a source.

13. The semiconductor device of claim 7, wherein first coefficient of thermal expansion is approximately $2.5 \times 10^{-6}$/K.

14. The semiconductor device of claim 7, wherein the encapsulant has a second coefficient of thermal expansion different than the first coefficient of thermal expansion.

15. The semiconductor device of claim 14, wherein second coefficient of thermal expansion is less than approximately $10 \times 10^{-6}$/K.

\* \* \* \* \*